United States Patent [19]

Bosnyak et al.

[11] Patent Number: 4,609,998
[45] Date of Patent: Sep. 2, 1986

[54] HIGH CONDUCTANCE CIRCUIT FOR PROGRAMMABLE INTEGRATED CIRCUIT

[75] Inventors: Robert J. Bosnyak, Los Gatos; Hua T. Chua, Los Altos Hills; Donald Goddard, Cupertino; Sing Wong, Sunnyvale, all of Calif.

[73] Assignee: Monolithic Memories, Inc., Santa Clara, Calif.

[21] Appl. No.: 562,506

[22] Filed: Dec. 15, 1983

[51] Int. Cl.[4] .............................................. G11C 17/00
[52] U.S. Cl. ........................................ 365/96; 365/94
[58] Field of Search .................. 365/94, 96, 103, 104, 365/189, 200; 307/202.1; 340/825.84

[56] References Cited

U.S. PATENT DOCUMENTS 3,792,319 2/1974 Tsang ................................ 365/96 X
4,319,341 3/1982 Fukushima et al. .................. 365/94

Primary Examiner—Joseph A. Popek
Attorney, Agent, or Firm—Steven F. Caserza; Alan H. MacPherson; Kenneth E. Leeds

[57] ABSTRACT

A unique programming circuit, suitable for use with programmable read-only memories (PROM), or other circuits utilizing programmable fuses, is provided which overcomes several distinct disadvantages of prior art programming circuits. The programming circuit of this invention includes a Darlington pair of programming transistors which allows only a single programming transistor to be made large in order to carry the large programming current, and only a single high current drive signal need be applied to the single programming transistor, thereby minimizing power consumption and integrated circuit die area.

15 Claims, 5 Drawing Figures

HIGH CONDUCTANCE CIRCUIT FOR PROGRAMMABLE INTEGRATED CIRCUIT

BACKGROUND OF THE INVENTION

This invention relates to integrated circuits, and more particularly, to integrated circuits which include the use of programmable links, such as fuses, which require a large current flow in order to be programmed to one of two selected states.

This invention is particularly well adapted for use in programmable read-only memories (PROM) and the like. One such PROM is shown in the schematic diagram of FIG. 1. The PROM circuit 10 shown in FIG. 1 includes a plurality of M word lines W1 through WM, and a plurality of N bit lines B1 through BN. A plurality of N×M memory cells is provided, each memory cell corresponding to the combination of a selected word line and a selected bit line. Each memory cell includes a transistor and a fuse. Thus, corresponding with the combination of word line W1 and bit line B1, a memory cell including transistor T11 and fuse F11 is formed. Similarly, for the combination of word line W1 and bit line B2, a memory cell including transistor T12 and fuse F12 is provided. In a similar manner, each of the N×M memory cells are provided, each including a transistor and a fuse, as shown. Initially, during the fabrication of the PROM 10, each fuse F11 through FMN is intact, thereby connecting the emitter of each transistor in the PROM memory array to its associated bit line. The collector of each transistor T11 through TMN is connected to a positive source of potential Vcc. During the read operation, Vcc is typically on the order of 5 volts and, during programming of PROM 10, is typically raised to approximately 12 volts in order to provide sufficient programming current to open selected fuses within the array.

Associated with each bit line, B1 through BN is a read circuit R1 through RN, respectively. Also associated with each bit line B1 through BN is a programming circuitry P1 through PN, respectively. During programming of the PROM, selected ones of fuses F11 through FMN are opened by causing a high current flow therethrough, thereby changing those selected memory cells from a logical 1 to a logical 0 by disconnecting the emitter of the cell's transistor from its associated bit line. During programming, a single word line W1 through WM is selected (placed high) and the remaining word lines are deselected (placed low). Thus, each transistor on the selected word line is turned on, then each transistor on the deselected word lines are turned off. Program means P1 through PN are then used to cause a programming current to flow through selected ones of the memory cells along the selected word line. For example, if word line W1 is selected, and it is desired to program fuse F11 to a logical zero state, programming means P1 will provide a high conductance path to ground, thereby causing current to flow from Vcc, through the collector of transistor T11 to the emitter of transistor T11, through fuse F11 to bit line B1, through programming P1, to ground. This causes a sufficient amount of current to flow through fuse F11 to cause fuse F11 to open, thus causing fuse F11 to store a logical zero. Conversely, when, during programming, it is not desired to open a particular fuse on the selected word line, the programming means associated with that fuse does not cause programming current to flow. Thus, as in the previous example, when word line W1 is selected in order to program fuse F11 with a logical zero state and it is desired to leave F12 intact in order to store logical one, programming means P2 will provide a low conductance (i.e. high impedance) path, thereby preventing current from flowing from Vcc through the collector of transistor T12 to the emitter of transistor T12 and through fuse F12, thereby preventing fuse F12 from being opened. In this manner, each fuse along a selected word line is programmed to a logical one or a logical zero state, as desired. Each word line which is desired to be programmed is programmed in sequence, thus causing the entire PROM array to be programmed.

During reading, each programming means P1 through PN provides a high impedance path, thereby effectively being disconnected from the circuit. During reading, a desired word line is selected by making it high, and remaining word lines are deselected by making them low. Thus, during the read operation, the transistors along a selected word line will be turned on, and the transistors along the deselected word lines will remain off. With the transistors along a selected word line turned on, current will flow from Vcc connected to their collectors, to their associated bit lines if and only if the associated fuse remains intact. Thus, for example, as in the previous example, with fuse F11 open and fuse F12 intact, word line W1 is brought high and word lines W2 through WN are brought low. Thus, transistors T11 through T1N are turned on. With fuse F11 open, current does not flow from Vcc to the collector of transistor T11 to the emitter of transistor T12 through fuse F11 to bit line B1, and thus bit line B1 remains low. Read means R1 senses this low signal on bit line B1, and provides a logical zero output signal. Conversely, with fuse F12 remaining intact, and word line W1 selected, current flows from Vcc through the collector of transistor T12 to the emitter of transistor T12 through fuse F12 to bit line B2, thus placing bit line B2 high. Read means R2 senses this high on bit line B2, and provides a logical one output signal.

A number of circuits are known in the prior art which will serve as read means R1 through RN and programming means P1 through PN. For example, one such prior art read means R1 is shown in the schematic diagram of FIG. 2. Read means R1 includes a first terminal 21 which is connected to an internal voltage supply (typically 3 volts), and a second terminal 24 which receives an enable signal which, when high, enables read means R1 to read the signal on bit line B1 and provide an output signal on output lead O1 and which, when low, disables read means R1. Resistor 22 has one lead connected to terminal 21 and its second lead connected to the anode of Schottky diode 23. The cathode of Schottky diode 23 is connected to terminal 24 as shown. Read means R1 also includes Schottky NPN transistor 25, having its base connected to the anode of Schottky diode 23. The collector of Schottky transistor 25 is connected to bit line B1 and the emitter of Schottky transistor 25 serves as an output terminal O1. During reading of bit line B1, the voltage applied to the base of Schottky transistor 25 is thus positive, thereby forward biasing the base-emitter junction of transistor 25, thus turning transistor 25 on. With transistor 25 turned on, the voltage on bit line B1 which, as described above, is provided by the state of the cell connected to bit line B1 and associated with the selected word line, is applied to output terminal O1, thereby providing an output signal indicating the state of the selected memory cell along bit line B1. The criteria for constructing such a read means are minimal in that high speed is desired, but a relatively low current level is necessary in order to provide an output signal suitable for use with other circuitry. This is not the case with programming means P1 through PN (FIG. 1) which must provide a high conductance path during programming in order to allow a relatively large programming current (typically 50 mA) to flow in order to open selected fuses.

One such prior art programming means P1 is shown in the schematic diagram of FIG. 3. Programming means P1 includes a first terminal 31 for receiving a positive enabling voltage during programming, a second terminal 34 for receiving a voltage selecting bit line B1 (i.e., for decoding which bit line B1 through BN is to be programmed in accordance with the signal provided on output lead O1) and a terminal 39 that is controlled by the output lead O1 (not shown). Terminal 39 is used to enable the programming transistor 38. Node 40 is a common terminal provided to make a conducting path (controlled by the signal on output lead O1) between a selected one of a plurality of decoding means D1 through DN associated with bit lines B1 through BN, respectively, and programming transistor 38. Resistor 32 has one end connected to terminal 31 and its other end connected to the anode of Schottky diode 33. The cathode of Schottky diode 33 is connected to terminal 34. The base of NPN transistor 35 is connected to the anode of Schottky diode 33. The collector of NPN transistor 35 is connected to terminal 31, and the emitter of transistor 35 is connected through resistor 36 to ground. The base of transistor 37 is connected to the emitter of transistor 35, the emitter of transistor 37 is connected to the collector of programming transistor 38, the collector of transistor 37 is connected to bit line B1 and the emitters of the transistors 38 of programming means P1 through PN (FIG. 1) are connected to the collector 40 of transistor 38. The emitter of transistor 38 is connected to ground. Terminal 34 is connected to a decoding circuit (not shown) that uniquely selects a single one of decoding means D1 through DN and thus a unique one of bit lines B1 through BN. During programming, the voltage applied to output lead O1 determines whether the selected fuse associated with the selected word line will be opened. For example, during programming, a word line is selected, a bit line is selected and thus terminal 34 and node 40 are placed high. The base of transistor 35 is high, and transistor 35 thus turns on, in turn causing transistor 37 to turn on if transistor 38 is on. Transistor 38 turns on when, during programming, output lead O1 is placed high. With transistor 37 turned on, bit line B1 is connected to node 40 and with transistor 38 on, thereby causing sufficient current to flow through the fuse connected to bit line B1 associated with the selected word line, thus causing that fuse to be opened in order to store a logical zero. Conversely when, during programming, a word line and bit line are selected and output terminal O1 and thus terminal 39 is held low, the base 39 of transistor 38 is low, transistor 38 is off, thereby causing transistor 37 to be off, and thus current does not flow through bit line B1 and the fuse connected to bit line B1 associated with the selected word line and selected bit line is not opened. With the fuse remaining intact, a logical one is stored. Of importance, transistors 38 and 37 must be made quite large in order to allow sufficient current to flow from bit line B1 to ground during programming in order to cause selected fuses on bit line B1 to be opened.

Programming means P1 shown in FIG. 3 has the disadvantage that two high conductivity transistors 37 and 38 must turn on in order to program a selected fuse. The total resistance of this series path must be kept low to facilitate fusing. Since these transistors are in series, their resistance adds. Each transistor must be made large in order to reduce this resistance. Furthermore, two of the signals required to operate this circuit (terminal 31 and terminal 39 programming signal) require relatively high currents. Transistors 37 and 38 each require approximately 5 mA drive, thus requiring a significant amount of current from terminals 31 and 39, respectively. This increases power consumption of the device and increases integrated circuit die area.

Another prior art programming means P1 is shown in the schematic diagram of FIG. 4. In this circuit, terminals 50-1 through 50-N are connected to an enabling signal used to select a single one of bit lines B1 through BN during program and terminal 52 is connected to the output lead O1 (FIG. 2) of the PROM. During programming, when output lead O1, and thus terminal 52, is high, transistor 53 turns on and, with transistor 51 turned on, bit line B1 is connected to ground, thereby causing the fuse connected to bit line B1 associated with the selected word line, to be opened, thereby storing a logical zero. Conversely, with output lead O1 and thus terminal 52 low, transistor 53 is off and thus bit line B1 is not connected to ground, thus causing the fuse connected to bit line B1 associated with the selected word line to remain intact, thereby storing a logical one. This prior art circuit has the same disadvantages as previously mentioned with regard to the prior art circuit of FIG. 3 in that transistors 51-1 through 51-N and transistor 53 must all be made large in order to carry the required programming current and each lead 50-1 through 50-N and lead 52 must receive high driving signals. These requirements necessitate a relatively large power consumption and large integrated circuit die area.

SUMMARY

In accordance with the teachings of this invention, a unique programming means, suitable for use with programmable read-only memories (PROM), or other circuits utilizing programmable fuses, is provided, which overcomes several distinct disadvantages of prior art programming means. The programming means of this invention includes a Darlington pair of programming transistors which allows only a single programming transistor to be made large in order to carry the large programming current of a selected bit line, and only a single high current drive signal need be applied to the single programming transistor, thereby minimizing power consumption and integrated circuit die area.

DETAILED DESCRIPTION

Figure 5:
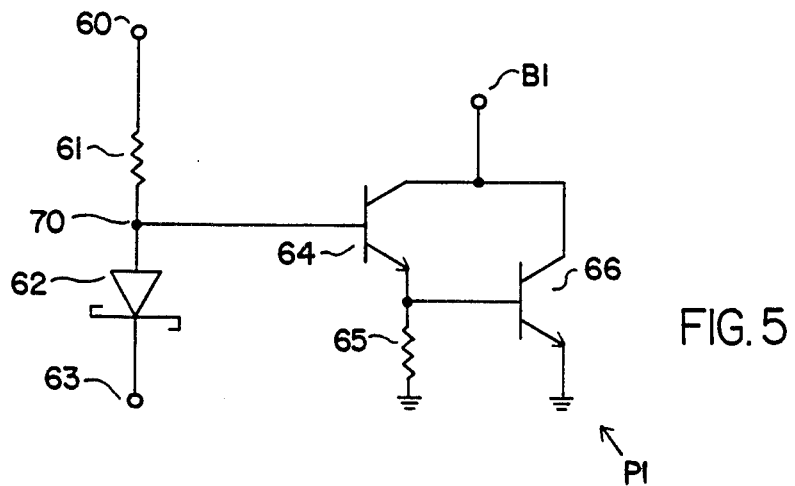
FIG. 5 is a schematic diagram of one embodiment of a programming means P1 constructed in accordance with the principals of this invention.

One embodiment of a programming means P1 constructed in accordance with this invention is shown in the schematic diagram of FIG. 5. As shown in FIG. 5, programming means P1 includes terminal 60 connected to a decoding means (not shown), for receiving, during programming of fuses along bit line B1, a positive enabling voltage. Terminal 63 is connected to output terminal O1 (not shown) of the PROM device. It should be understood that additional circuitry may be used to connect output terminal O1 of the PROM to terminal 63; however, such additional circuitry, if used, will generally be of a design well known in the prior art, and thus will not be described in detail here as the specific design of such additional circuitry, or indeed whether such additional circuitry is even used between the output lead O1 of the PROM device and terminal 63, is of no importance in the practice of our invention. Programming means P1 in FIG. 5 also includes a resistor 61 (typically 1K ohms) having a first end connected to terminal 60 and a second end connected to the anode of Schottky diode 62. The cathode of Schottky diode 62 is connected to terminal 63. Programming means P1 of FIG. 5 also includes a Darlington pair of transistors formed by NPN transistor 64 having its base connected to the anode of Schottky diode 62, its collector connected in common with the collector of NPN transistor 66 to bit line B1, its emitter connected to the base of NPN transistor 66, with the emitter of NPN transistor 66 being connected to ground. The base of transistor 66 is also connected to ground through resistor 65 (typically 1K ohms).

During programming of a fuse along bit line B1 of the PROM device of which programming means P1 of FIG. 5 is a part, Vcc is raised to approximately 12 volts and a positive voltage (typically 5 volts) is applied to terminal 60, thereby selecting bit line B1 for programming. Then, when output lead O1, and thus terminal 63, goes high, the voltage applied to the base of transistor 64 is positive (typically 1.5 volts), thus turning on both transistors 64 and 66. With transistors 64 and 66 turned on, the bit line B1 is connected to ground through a high conductance path provided by transistor 66. With bit line B1 grounded, sufficient current (typically 50 mA) flows through the fuse connected to bit line B1 associated with the selected word line, thus causing that fuse to open, thereby programming that fuse to store a logical zero. Conversely, when during programming a fuse along selected bit line B1, the output lead O1 and thus terminal 63 is low, the base of transistor 64 is pulled low (typically 0.8 volts) and thus transistor 64 is turned off. With transistor 64 turned off, resistor 65 pulls the base of transistor 66 low, thereby causing transistor 66 to remain off. With transistors 64 and 66 turned off, bit line B1 is not connected to ground through transistor 64 or 66, and thus, programming current does not flow through the fuse connected to bit line B1 associated with the selected word line, thus leaving that fuse intact in order to store a logical one.

Figure 1:
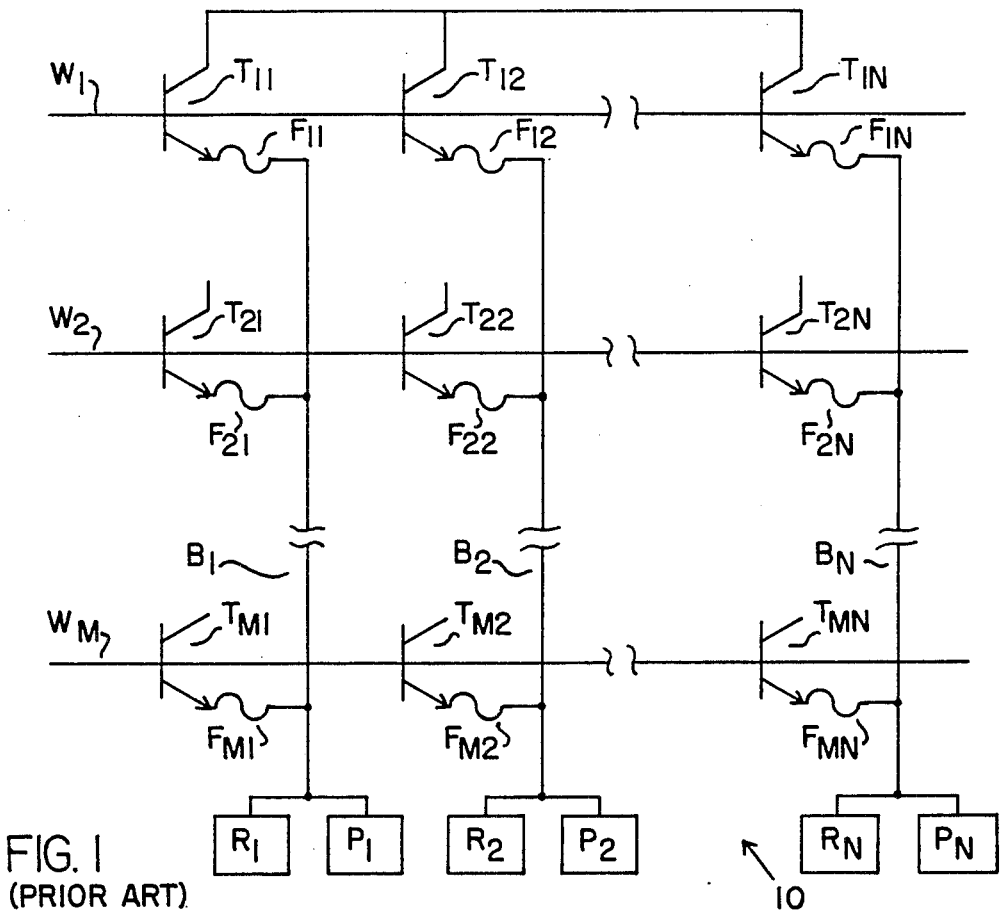
FIG. 1 is a schematic diagram of the typical programmable read-only memory.
Figure 2:
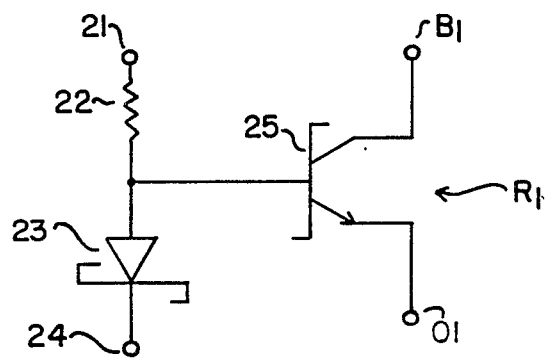
FIG. 2 is a schematic diagram of a prior art embodiment of the read means R1 shown in the schematic diagram of FIG. 1.
Figure 3:
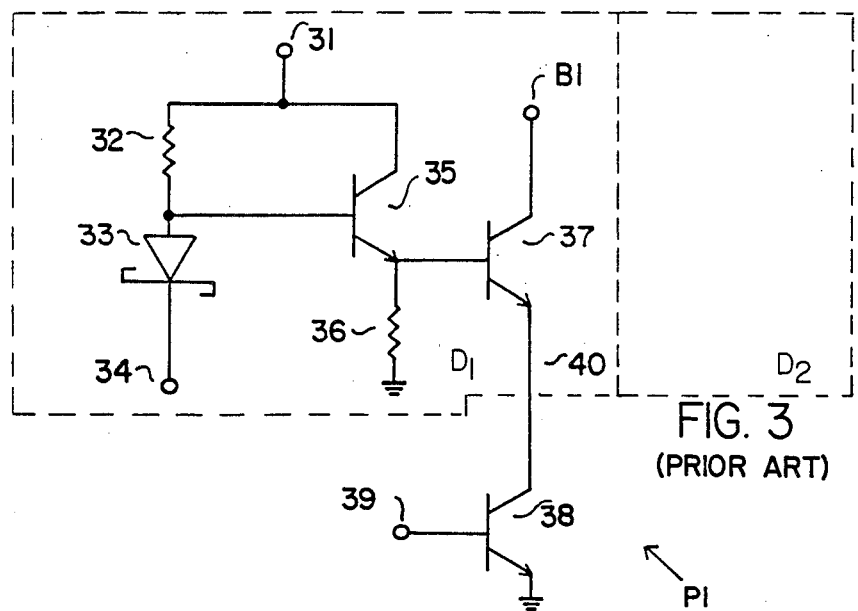
FIG. 3 is a schematic diagram of one embodiment of a prior art programming means P1 shown in the schematic diagram of FIG. 1.
Figure 4:
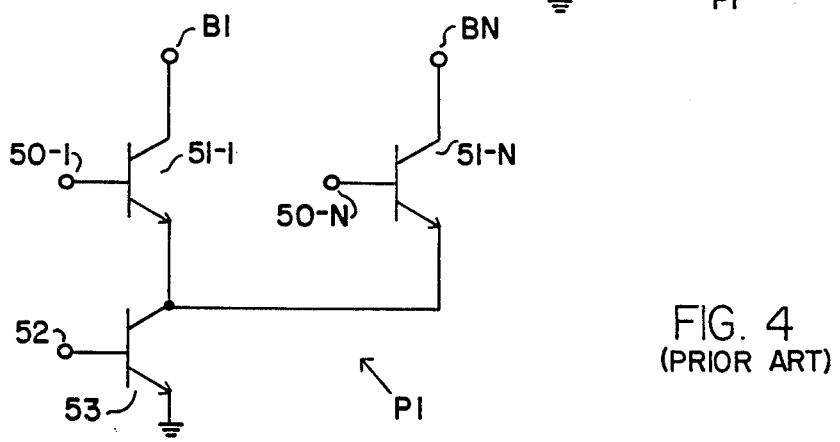
FIG. 4 is a schematic diagram of yet another embodiment of a prior art programming means P1 shown in the schematic diagram of FIG. 1.

In accordance with the teaching of this invention, the programming means P1 of FIG. 5 requires only one large transistor 66 for the programming of selected fuses along bit line B1. Terminal 60 provides base drive for the Darington pair transistor 64 through resistor 61. At terminal 70 a merged signal is provided as a function of the bit line selecting signal applied to terminal 60 and the programming signal from output lead O1. The required drive current at the base of transistor 66 is typically 5 mA and is easily provided from the emitter of transistor 64 as part of the programming current flowing through the fuse being programmed and bit line B1. The drive requirements at the base of transistor 64 is typically 0.5 mA, significantly less than the approximately 5 mA required to drive the decoding transistors 35 of the prior art structure of FIG. 3 or the decoding transistors 51-1 through 51-N of the prior art structure of FIG. 4. The use of a single high conductivity transistor 66 in accordance with the teachings of this invention reduces the number of large transistors required, as compared with prior art devices. The total drive current required for programming is also reduced significantly, thereby reducing power consumption and greatly easing circuit design and fabrication. Furthermore, the conductivity of the programming path is greatly increased while simultaneously decreasing the required integrated circuit device area, minimizing power supply requirements during programming, and increasing device yield as compared with prior art devices.

The specific embodiments presented in the specification are intended to serve by way of example only and are not to be construed as limitations on the scope of our invention. Many other embodiments of our invention will become apparent to those of ordinary skill in the art in light of the teachings of this specification.

We claim:

1. Programming circuit for selectively causing a programming current to flow through a fusing device, said fusing device having a first lead connected to a first reference voltage and having a second lead, said programming circuit comprising:
   a first terminal connected to said second lead of said fusing device;
   a first transistor having a collector, an emitter, and a base, wherein said collector is connected to said first terminal;
   a second transistor having a collector connected to said first terminal and to said collector of said first transistor, a base connected to said emitter of said first transistor, and an emitter connected to a second reference voltage, wherein said base of said first transistor receives a signal defining whether said fusing device is to be opened or is to remain intact.

2. A structure as in claim 1 which further comprises:
   an enable terminal for receiving an enabling signal which causes said programming circuit to be enabled during programming and causes said programming circuit to be disabled at other times;
   a second terminal for receiving a signal defining when, during programming, said fusing device is to be opened or is to remain intact;
   a voltage divider means connected between said second terminal and a third terminal and said voltage divider means having a tap connected to the base of said first transistor.

3. A structure as in claim 2 wherein said voltage divider means comprises a resistor having one end connected to said second terminal and a second end connected to the base of said first transistor and a diode having one terminal connected to the base of said first transistor and one terminal connected to said third terminal.

4. The structure as in claim 3 wherein said first reference voltage is more positive than said second reference voltage, and said first and said second transistors are NPN transistors, and said first terminal of said diode is an anode and said second terminal of said diode is a cathode.

5. Structure as in claim 4 wherein said diode is a Schottky diode.

6. A structure according to claim 2 wherein a decoding means is connected to said second terminal of said programming circuit, said decoding means being adapted to select a bit line to be programmed and to generate an enabling signal to said selected bit line.

7. A structure as in claim 1 wherein said programming circuit includes a plurality of M word lines W1 through WM and a plurality of N bit lines B1 through BN.

8. A structure as in claim 7 wherein said plurality of M word lines and N bit lines comprise an array consisting of a plurality of M×N memory cells.

9. A structure as in claim 8 wherein each said memory cell includes a transistor and a fuse.

10. A structure as in claim 1 wherein said programming circuit is adapted to select a desired word line by driving said work line high, and is adapted to concurrently deselect the remaining word lines by making them low.

11. A programmable read only memory comprising:
a plurality of M word lines, where M is an integer greater than or equal to one;
a plurality of N bit lines, where N is an integer greater than or equal to one;
a plurality of N×M memory cells, each said memory cell being uniquely connected to one of said plurality of M word lines and to one of said plurality of N bit lines, each of said memory cells having a first electrical state prior to receiving a programming signal and having a different electrical state after receiving said programming signal, and wherein each said memory cell comprises:
a programmable element, having a first lead and having a second lead connected to an associated bit line;
an access transistor having a collector for receipt of a first supply voltage to provide a programming current, a base connected to an associated word line for receipt of said programming signal being transmitted on said associated work line, an emitter connected to said first lead of said programmable element;
a first programming transistor having:
a collector connected to said associated bit line and thereby to said second lead of said programmable element;
a base for receiving a drive signal during programming of said programmable element; and
an emitter connected to a second supply voltage; a second programming transistor having:
a collector connected to said collector of said first programming transistor;
a base connected to said emitter of said first programming transistor; and
an emitter connected to said second supply voltage.

12. A programmable read only memory as in claim 11 wherein said first and second programming transistors provide a high conductance path along said associated bit line such that upon receipt of said programming signal on said base of a selected one of said access transistors, and upon receipt of said drive signal on said base of said first programming transistor, a programming current is conducted through said programmable element of the selected memory cell associated with said selected access transistor, said associated bit line and said collectors of said first and second programming transistors, said first and second programming transistors thereby conducting said programming current on said associated bit line causing said programmable element to open, thereby programming said programmable element to store said different electrical state.

13. A programmable read only memory according to claim 12, further comprising:
a programming enable terminal for receiving said drive current for application to the base of said first programming transistor;
pull up means connected between said programming enable terminal and said base of said first programming transistor;
pull down means connected between said base of said first programming transistor and a terminal for receiving a signal indicative of the desired programmed state of said selected memory cell.

14. A programmable read only memory according to claim 13 wherein said pull up and said pull down means are selected from the group of devices consisting of resistors, diodes, and Schottky diodes.

15. A programmable read only memory according to claim 11 wherein said base of said second programming transistor receives a drive current provided from said emitter of said first programming transistor as part of the programming current flowing through said programmable element.

* * * * *